United States Patent
Noh et al.

(10) Patent No.: US 9,197,123 B2
(45) Date of Patent: Nov. 24, 2015

(54) POWER SUPPLYING APPARATUS HAVING A DETECTABLE USEFUL LIFE

(71) Applicant: SAMSUNG ELECTRO-MECHANICS CO., LTD., Suwon, Gyunggi-do (KR)

(72) Inventors: Young Seung Noh, Gyunggi-do (KR); Bo Mi Lee, Gyunggi-do (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 95 days.

(21) Appl. No.: 13/887,265

(22) Filed: May 3, 2013

(65) Prior Publication Data

US 2014/0160813 A1   Jun. 12, 2014

(30) Foreign Application Priority Data

Dec. 7, 2012 (KR) .................. 10-2012-0141987

(51) Int. Cl.
*H02M 3/335* (2006.01)
*H02M 1/32* (2007.01)
*G01R 31/40* (2014.01)

(52) U.S. Cl.
CPC ............ *H02M 1/32* (2013.01); *H02M 3/33507* (2013.01); *G01R 31/40* (2013.01)

(58) Field of Classification Search
None
See application file for complete search history.

(56) References Cited

U.S. PATENT DOCUMENTS

| | | | | |
|---|---|---|---|---|
| 4,347,558 A | * | 8/1982 | Kalinsky | ............................ 363/17 |
| 5,594,384 A | * | 1/1997 | Carroll et al. | ................. 329/369 |
| 6,104,622 A | * | 8/2000 | Shin | ............................ 363/21.07 |
| 7,518,263 B2 | | 4/2009 | Gan et al. | |
| 8,335,092 B2 | * | 12/2012 | Matsumoto et al. | ........ 363/21.07 |
| 8,582,273 B2 | * | 11/2013 | Murata et al. | .................. 361/118 |
| 2003/0141857 A1 | * | 7/2003 | Nishida et al. | ................. 323/282 |
| 2004/0178782 A1 | * | 9/2004 | Yokoyama et al. | ............ 323/282 |
| 2008/0122411 A1 | * | 5/2008 | Nishida | ......................... 323/225 |

(Continued)

FOREIGN PATENT DOCUMENTS

| | | |
|---|---|---|
| JP | 2009-303455 A | 12/2009 |
| KR | 1997-0028931 | 6/1997 |
| KR | 2004-0099489 A | 12/2004 |

OTHER PUBLICATIONS

Richard Redl et al, Ripple-Based Control of Switching Regulators—An Overview; IEEE Journal, pp. 2669-2680; vol. 24, No. 12, Dec. 2009.

(Continued)

*Primary Examiner* — Timothy J Dole
*Assistant Examiner* — Ishrat Jamali
(74) *Attorney, Agent, or Firm* — McDermott Will & Emery LLP (57) ABSTRACT

There is provided a power supplying apparatus capable of determining whether to be normally operated by detecting whether a capacitor deteriorates with age based on a ripple voltage generated by switching of a primary side, the power supplying apparatus including a power supply unit switching input power to convert the input power into preset direct current (DC) power, a detecting unit setting a reference voltage based on the DC power of the power supply unit and comparing the reference voltage with a ripple voltage included in the DC power to detect a voltage level of the ripple voltage, and a controlling unit determining whether an abnormality has occurred according to a detection result of the detecting unit.

20 Claims, 5 Drawing Sheets

(56) References Cited

U.S. PATENT DOCUMENTS

2008/0285316 A1* 11/2008 Park et al. ....................... 363/50
2013/0016535 A1* 1/2013 Berghegger ............... 363/21.15

OTHER PUBLICATIONS

Korean Office Action issued in Application No. 10-2012-0141987 dated Nov. 12, 2013.

* cited by examiner

FIG. 5

POWER SUPPLYING APPARATUS HAVING A DETECTABLE USEFUL LIFE

CROSS-REFERENCE TO RELATED APPLICATIONS

This application claims the priority of Korean Patent Application No. 10-2012-0141987 filed on Dec. 7, 2012, in the Korean Intellectual Property Office, the disclosure of which is incorporated herein by reference.

BACKGROUND OF THE INVENTION

1. Field of the Invention

The present invention relates to a power supplying apparatus having a detectable useful life.

2. Description of the Related Art

Recently portable electronic devices have been implemented with systemization, digitization, wireless communications and multimedia capabilities, intelligence, complexity, and the like. Among them, as social interest in the implementation of multimedia capabilities has increased, small, portable multimedia devices have been prominent.

Among them, as mobile devices such as smartphones and a tablet personal computers (tablet PCs) have come to prominence as new information devices, new technology requirements for driving power supplying apparatuses such as an adapter for charging power in a battery of such an apparatus have increased.

In an existing driving power supplying apparatus, only standby power is regulated in public. However, as several functions such as touchscreens have been added to the mobile device, a situation in which the driving power supplying apparatus should significantly decrease an effect thereof on a main body during charging of a device has occurred.

Meanwhile, the power supplying apparatus as described above generally receives commercial alternating current (AC) power, converts the commercial AC power into direct current (DC) power appropriate for a device, and then supplies the DC power to the device, as disclosed in the following Related Art Document. Therefore, the power supplying apparatus includes various passive elements and active elements in order to convert and supply the power, such that a useful lifespan thereof is limited. In addition, when the useful lifespan of the power supplying apparatus ends, normal supplying of power from the power supplying apparatus is limited, such that the power may not be smoothly supplied to the device receiving the driving power from the power supplying apparatus.

RELATED ART DOCUMENT (Patent Document 1) Korean Patent Laid-Open Publication No. 10-2004-0099489

SUMMARY OF THE INVENTION

An aspect of the present invention provides a power supplying apparatus capable of determining whether to be normally operated by detecting whether a capacitor deteriorates with age based on a ripple voltage generated by switching of a primary side.

According to an aspect of the present invention, there is provided a power supplying apparatus including: a power supply unit switching input power to convert the input power into preset direct current (DC) power; a detecting unit setting a reference voltage based on the DC power of the power supply unit and comparing the reference voltage with a ripple voltage included in the DC power to detect a voltage level of the ripple voltage; and controlling unit determining whether an abnormality has occurred according to a detection result of the detecting unit.

The power supply unit may include a smoothing unit having a capacitor smoothing the power generated by rectifying the input power.

The detecting unit may detect the voltage level of the ripple voltage caused by the capacitor of the smoothing unit.

The detecting unit may include: a first dividing resistor group dividing a voltage level of the DC power according to a first preset resistance ratio; a second dividing resistor group dividing a voltage level of the DC power according to a second preset resistance ratio; a first capacitor stabilizing the voltage level divided by the second dividing resistor group; and a comparator comparing the divided voltage level transferred from the first dividing resistor group and input to a negative terminal thereof and the divided voltage level transferred from the second dividing resistor group and input to a positive terminal thereof.

The detecting unit may further include a second capacitor stabilizing the voltage level divided by the first dividing resistor group.

The first capacitor may have capacitance higher than that of the second capacitor.

The detecting unit may include: a dividing resistor group dividing a voltage level of the DC power according to a preset resistance ratio; first and second diodes transferring respective voltage levels divided by the dividing resistor group to different paths; a first capacitor stabilizing the voltage level from the first diode; and a comparator comparing the voltage level from the second diode input to a negative terminal thereof and the voltage level from the first diode input to a positive terminal thereof.

The detecting unit may further include a second capacitor stabilizing the voltage levels divided by the dividing resistor group.

The power supply unit may include: a rectifying unit rectifying the input power; a converting unit switching the power smoothed by the smoothing unit and transforming the switched power according to a preset turns ratio; and a stabilizing unit stabilizing the transformed power from the converting unit to output the stabilized power.

The power supplying apparatus may further include an outputting unit switching an output of the DC power on or off according to a control of the controlling unit.

The power supplying apparatus may further include a display unit displaying whether the abnormality has occurred according to a control of the controlling unit.

According to another aspect of the present invention, there is provided a power supplying apparatus including: a power supply unit including a smoothing unit having a capacitor smoothing power generated by rectifying input power and switching the smoothed power to convert the smoothed power into preset DC power; a detecting unit setting a reference voltage based on the DC power of the power supply unit and comparing the reference voltage with a ripple voltage included in the DC power by the capacitor of the smoothing unit to detect a voltage level of the ripple voltage; and a controlling unit determining whether an abnormality has occurred according to a detection result of the detecting unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIGS. 1 through 4 are circuit diagrams schematically showing power supplying apparatuses according to first to fourth embodiments of the present invention, respectively.

Figure 1:
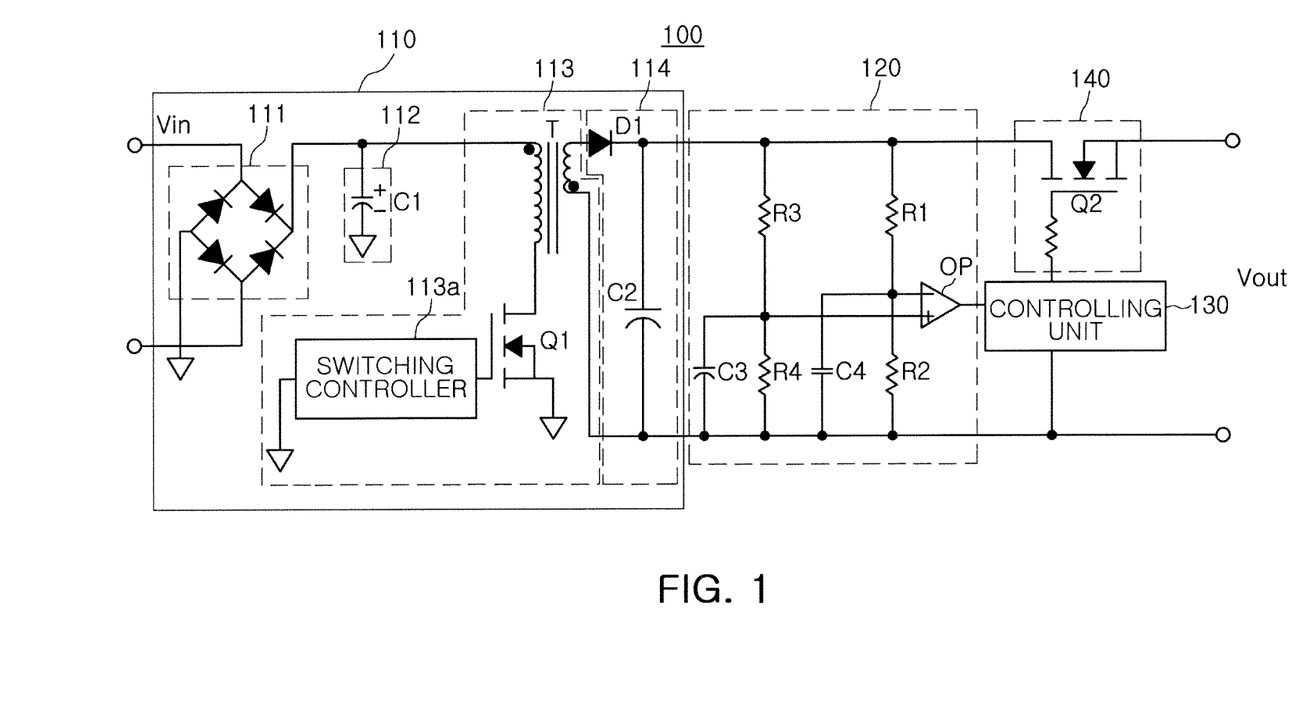
FIG. 1 is a circuit diagram schematically showing a power supplying apparatus according to a first embodiment of the present invention.

Referring to FIG. 1, a power supplying apparatus 100 according to the first embodiment of the present invention may include a power supply unit 110, a detecting unit 120, and a controlling unit 130, and further include an outputting unit 140.

The power supply unit 110 may include a rectifying unit 111 rectifying input power Vin, a smoothing unit 112 including a capacitor C1 smoothing the rectified power by the rectifying unit 111, a converting unit 113 switching the smoothed power from the smoothing unit 112 and transforming the switched power to output the transformed power, and a stabilizing unit 114 stabilizing the power output from the converting unit 113 to output the stabilized power.

The input power Vin may be commercial alternating current (AC) power, and the rectifying unit 111 may be configured of a bridge diode to half-wave or full-wave rectify the input power Vin.

The capacitor C1 of the smoothing unit 112 may be charged with the rectified power to smooth a waveform of the power. Therefore, a ripple voltage may be included in power output by a rear circuit.

The converting unit 113 may include a switch Q1 switching the smoothed power, a switching controller 113a controlling a power switching operation of the switch Q1, and a transformer T having a primary winding receiving the switched power and a secondary winding electromagnetically coupled to the primary winding to form a preset turns ratio therewith and transforming the switched power to output the transformed power according to the turns ratio.

The stabilizing unit 114 may include a diode D1 and a capacitor C2 to stabilize the power output from the secondary winding of the transformer T. The ripple voltage caused due to the capacitor C1 of the smoothing unit 112 may be transferred to a capacitor C2 and included in DC power transferred to the rear circuit.

The detecting unit 120 may include a first dividing resistor group R1 and R2, a second dividing resistor group R3 and R4, a first capacitor C3, and a comparator OP, and further include a second capacitor C4.

Each of the first dividing resistor group R1 and R2 and the second dividing resistor group R3 and R4 may have a preset resistance ratio and divide the DC power from the stabilizing unit 114 according to the resistance ratio.

The first capacitor C3 may stabilize the divided voltage from the second dividing resistor group R3 and R4 and input the stabilized voltage to a positive (+) terminal of the comparator OP, and the input voltage may be a reference voltage.

The first dividing resistor group R1 and R2 may divide the DC power from the stabilizing unit 114 according to the resistance ratio and input the divided voltage to a negative (−) terminal of the comparator OP. Therefore, a voltage level of the ripple voltage included in the DC power from the stabilizing unit 114 may be detected, and the comparator OP may compare a voltage level of the reference voltage with the voltage level of the ripple voltage included in the DC power.

To this end, the first capacitor C3 may stabilize the divided voltage from the second dividing resistor group R3 and R4, and capacitance of the first capacitor C3 may be higher than that of the second capacitor C4 in the case in which the second capacitor C4 is further provided in order to decrease noise.

The controlling unit 130 may recognize whether the power is unstable due to deterioration with age of the capacitor C1 according to a comparison result from the comparator OP and block the supplying of the power or allow a power abnormality to be displayed when it recognizes that the power is unstable. More specifically, when the capacitor C1 deteriorates with age, a difference in voltage level between a maximum voltage and a minimum voltage of the ripple voltage may be high, and the controlling unit 130 may receive the comparison result of the comparator OP and determined that the DC power is unstable due the deterioration with age of the capacitor C1 in the case in which the difference in voltage level between the maximum voltage and the minimum voltage of the ripple voltage is larger than a preset normal voltage level range.

The power supplying apparatus 100 according to the first embodiment of the present invention shown in FIG. 1 may include the outputting unit 140, and the outputting unit 140 may include a switch Q2 switched on or off according to a control of the controlling unit 130 to supply or block the DC power.

Figure 2:
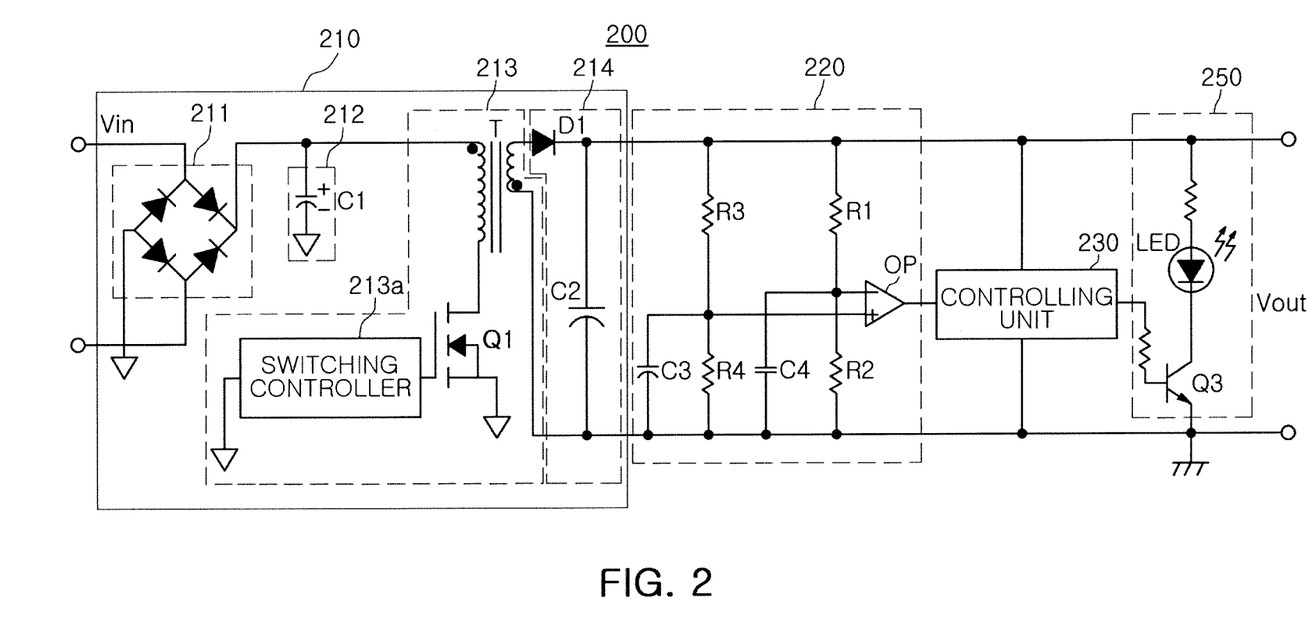
FIG. 2 is a circuit diagram schematically showing a power supplying apparatus according to a second embodiment of the present invention.

A power supplying apparatus 200 according to the second embodiment of the present invention shown in FIG. 2 may include a power supply unit 210 including a rectifying unit 211, a smoothing unit 212, a converting unit 213, and a stabilizing unit 214, a detecting unit 220, and a controlling unit 230. Since operations and functions of the above-mentioned components are the same as or similar to those of the power supply unit 110, the detecting unit 120, and the controlling unit 130 of the power supplying apparatus 100 according to the first embodiment of the present invention shown in FIG. 1, respectively, a detailed description thereof will be described.

However, the controlling unit 230 may recognize whether the power is unstable due to deterioration with age of the capacitor C1 according to the comparison result from the comparator OP, and allowing a light emitting diode (LED) to emit light through a switch Q3 of a display unit 250, rather than stopping the output of the DC power when the DC power is determined to be unstable due to the deterioration with age of the capacitor C1, thereby displaying that the DC power is unstable to the outside.

Figure 3:
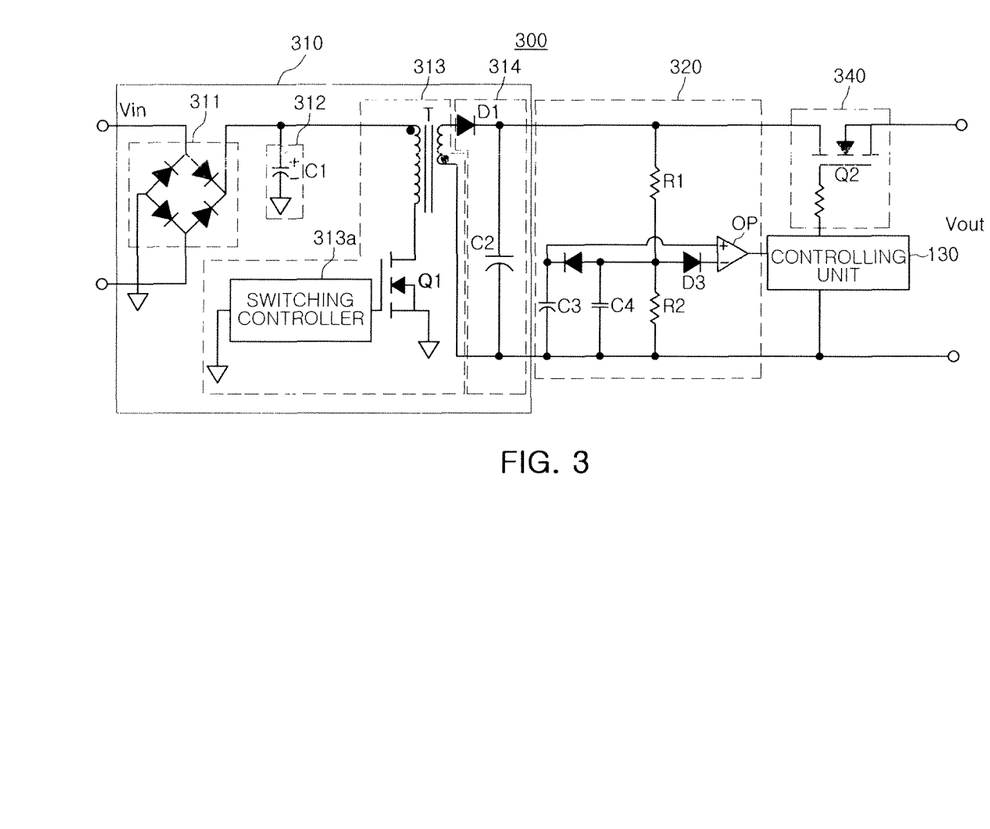
FIG. 3 is a circuit diagram schematically showing a power supplying apparatus according to a third embodiment of the present invention.
Figure 4:
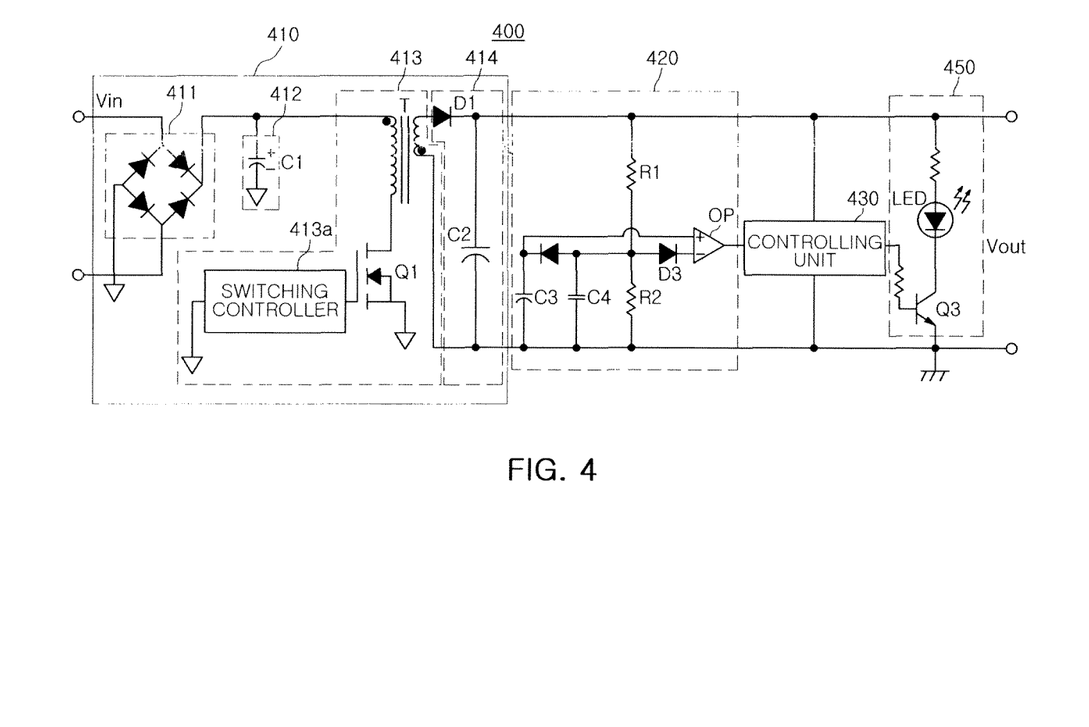
FIG. 4 is a circuit diagram schematically showing a power supplying apparatus according to a fourth embodiment of the present invention.

In power supplying apparatuses 300 and 400 according to the third and fourth embodiments of the present invention shown in FIGS. 3 and 4, since configurations and functions of power supply units 310 and 410 including rectifying units 311 and 411, smoothing units 312 and 412, converting units 313 and 413, and stabilizing units 314 and 414, controlling units 330 and 430, and an outputting unit 340 or a displaying unit 450 except for configurations and functions of detecting units 320 and 420 are the same as or similar to those of the power supplying apparatus 100 and 200 according to the first and second embodiments of the present invention shown in FIGS. 1 and 2, respectively, a detailed description thereof will be omitted.

Describing the detecting units 320 and 420 of the power supplying apparatuses 300 and 400 according to the third and fourth embodiments of the present invention shown in FIGS. 3 and 4, the detecting units 320 and 420 may include the dividing resistor group R1 and R2, first and second diodes D2 and D3, and the first and second capacitors C3 and C4, and the comparator OP, respectively.

The dividing resistor group R1 and R2 may have a preset resistance ratio and divide the DC power from the stabilizing unit 314 or 414 according to the resistance ratio.

The first and second diodes D2 and D3 may transfer respective voltages divided by the dividing resistor group R1 and R2 to different paths, more specifically, a positive (+) terminal or a negative (−) terminal of the comparator OP.

The first capacitor C3 may stabilize the voltage transferred from the first diode D2 and transfer the stabilized voltage to the positive (+) terminal of the comparator OP, and the voltage from the second diode D3 may be transferred to the negative (−) terminal of the comparator OP. A comparison result of the comparator OP may be transferred to the controlling unit 330 or 430. Likewise, in the case in which the second capacitor C4 is further provided in order to decrease noise, capacitance of the first capacitor C3 may be larger than that of the second capacitor C4.

Figure 5:
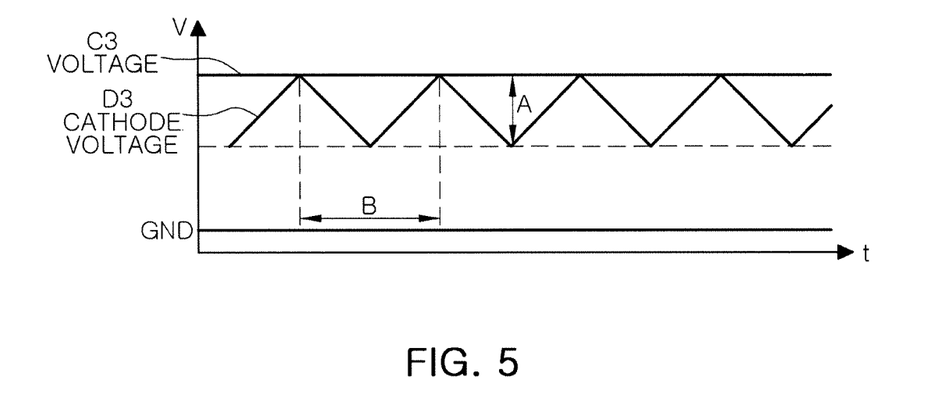
FIG. 5 is a graph showing signal waveforms of main components of the power supplying apparatus according to the embodiment of the present invention.

FIG. 5 is a graph showing signal waveforms of main components of the power supplying apparatus according to the embodiment of the present invention.

Referring to FIG. 5 together with FIG. 3 or FIG. 4, the voltage from the first capacitor C3 may be set to a reference voltage, and a difference in voltage level between the maximum voltage and the minimum voltage of a ripple voltage from the second diode D3 is transferred to the controlling unit 330 or 430, such that the controlling unit 330 or 430 may determine whether the DC power is unstable due to the deterioration with age of the capacitor C1.

In FIG. 5, the ripple voltage from the second diode D3 is shown. However, referring to FIG. 1 or FIG. 2, the divided voltages of the first dividing resistance group R1 and R2 will be the same as the ripple voltage from the second diode D3. Therefore, the controlling unit 130 or 230 may determine whether the DC power is unstable due to the deterioration with age of the capacitor C1.

As set forth above, according to the embodiments of the present invention, whether a capacitor deteriorates with age is detected based on the ripple voltage generated by the switching of the primary side to thereby recognize whether the power supplying apparatus is normally operated, whereby the supplying of unstable power to a device can be prevented in advance.

While the present invention has been shown and described in connection with the embodiments, it will be apparent to those skilled in the art that modifications and variations can be made without departing from the spirit and scope of the invention as defined by the appended claims.

What is claimed is:

1. A power supplying apparatus comprising:
    a power supply unit switching input power of a primary side to convert the input power into preset direct current (DC) power;
    a detecting unit setting a reference voltage based on the DC power of the power supply unit and comparing the reference voltage with a ripple voltage included in the DC power to detect a voltage level of the ripple voltage in a secondary side insulated from the primary side; and
    a controlling unit determining whether an abnormality has occurred according to a detection result of the detecting unit,
    wherein the detecting unit includes:
        a dividing resistor group dividing a voltage level of the DC power according to a preset resistance ratio;
        first and second diodes transferring respective voltage levels divided by the dividing resistor group to different paths;
        a first capacitor stabilizing the voltage level from the first diode; and
        a comparator comparing the voltage level from the second diode input to a negative terminal thereof and the voltage level from the first diode input to a positive terminal thereof.

2. The power supplying apparatus of claim 1, wherein the power supply unit includes a smoothing unit having a capacitor smoothing the power generated by rectifying the input power.

3. The power supplying apparatus of claim 2, wherein the detecting unit detects the voltage level of the ripple voltage caused by the capacitor of the smoothing unit.

4. The power supplying apparatus of claim 1, wherein the detecting unit includes:
    a first dividing resistor group dividing a voltage level of the DC power according to a first preset resistance ratio;
    a second dividing resistor group dividing a voltage level of the DC power according to a second preset resistance ratio;
    a first capacitor stabilizing the voltage level divided by the second dividing resistor group; and
    a comparator comparing the divided voltage level transferred from the first dividing resistor group and input to a negative terminal thereof and the divided voltage level transferred from the second dividing resistor group and input to a positive terminal thereof.

5. The power supplying apparatus of claim 4, wherein the detecting unit further includes a second capacitor stabilizing the voltage level divided by the first dividing resistor group.

6. The power supplying apparatus of claim 5, wherein the first capacitor has capacitance higher than that of the second capacitor.

7. The power supplying apparatus of claim 1, wherein the detecting unit further includes a second capacitor stabilizing the voltage levels divided by the dividing resistor group.

8. The power supplying apparatus of claim 7, wherein the first capacitor has capacitance higher than that of the second capacitor.

9. The power supplying apparatus of claim 2, wherein the power supply unit includes:
    a rectifying unit rectifying the input power;
    a converting unit switching the power smoothed by the smoothing unit and transforming the switched power according to a preset turns ratio; and a stabilizing unit stabilizing the transformed power from the converting unit to output the stabilized power.

10. The power supplying apparatus of claim 1, further comprising an outputting unit switching an output of the DC power on or off according to a control of the controlling unit.

11. The power supplying apparatus of claim 1, further comprising a display unit displaying whether the abnormality has occurred according to a control of the controlling unit.

12. A power supplying apparatus comprising:
a power supply unit including a smoothing unit having a capacitor smoothing power generated by rectifying input power of a primary side and switching the smoothed power to convert the smoothed power into preset DC power;
a detecting unit setting a reference voltage based on the DC power of the power supply unit and comparing the reference voltage with a ripple voltage included in the DC power by the capacitor of the smoothing unit to detect a voltage level of the ripple voltage in a secondary side insulated from the primary side; and
a controlling unit determining whether an abnormality has occurred according to a detection result of the detecting unit,
wherein the detecting unit includes:
a dividing resistor group dividing a voltage level of the DC power according to a preset resistance ratio;
first and second diodes transferring respective voltage levels divided by the dividing resistor group to different paths;
a first capacitor stabilizing the voltage level from the first diode; and
a comparator comparing the divided voltage level transferred from the first dividing resistor group and input to a negative terminal thereof and the divided voltage level transferred from the second dividing resistor group and input to a positive terminal thereof.

13. The power supplying apparatus of claim 12, wherein the detecting unit includes:
a first dividing resistor group dividing a voltage level of the DC power according to a first preset resistance ratio;
a second dividing resistor group dividing a voltage level of the DC power according to a second preset resistance ratio;
a first capacitor stabilizing the voltage level divided by the second dividing resistor group; and
a comparator comparing the divided voltage level transferred from the first dividing resistor group and input to a negative terminal thereof and the divided voltage level transferred from the second dividing resistor group and input to a positive terminal thereof.

14. The power supplying apparatus of claim 13, wherein the detecting unit further includes a second capacitor stabilizing the voltage level divided by the first dividing resistor group.

15. The power supplying apparatus of claim 14, wherein the first capacitor has capacitance higher than that of the second capacitor.

16. The power supplying apparatus of claim 12, wherein the detecting unit further includes a second capacitor stabilizing the voltage levels divided by the dividing resistor group.

17. The power supplying apparatus of claim 16, wherein the first capacitor has capacitance higher than that of the second capacitor.

18. The power supplying apparatus of claim 12, wherein the power supply unit includes:
a rectifying unit rectifying the input power;
a converting unit switching the power smoothed by the smoothing unit and transforming the switched power according to a preset turns ratio; and
a stabilizing unit stabilizing the transformed power from the converting unit to output the stabilized power.

19. The power supplying apparatus of claim 12, further comprising an outputting unit switching an output of the DC power on or off according to a control of the controlling unit.

20. The power supplying apparatus of claim 12, wherein further comprising a display unit displaying whether the abnormality has occurred according to a control of the controlling unit.

* * * * *